United States Patent
Jaaskelainen et al.

(10) Patent No.: US 11,905,800 B2
(45) Date of Patent: Feb. 20, 2024

(54) DOWNHOLE FLOW SENSING WITH POWER HARVESTING

(71) Applicant: Halliburton Energy Services, Inc., Houston, TX (US)

(72) Inventors: Mikko K. Jaaskelainen, Houston, TX (US); Julian Drew, Centennial, CO (US); Barry Fish, Denver, CO (US)

(73) Assignee: Halliburton Energy Services, Inc., Houston, TX (US)

( * ) Notice: Subject to any disclaimer, the term of this patent is extended or adjusted under 35 U.S.C. 154(b) by 71 days.

(21) Appl. No.: 17/749,605

(22) Filed: May 20, 2022

(65) Prior Publication Data

US 2023/0374887 A1 Nov. 23, 2023

(51) Int. Cl.
*E21B 41/00* (2006.01)
*H02N 2/18* (2006.01)

(52) U.S. Cl.
CPC .......... *E21B 41/0085* (2013.01); *H02N 2/185* (2013.01)

(58) Field of Classification Search
CPC ............................ E21B 41/0085; H02N 2/185
See application file for complete search history.

(56) References Cited

U.S. PATENT DOCUMENTS

| | | |
|---|---|---|
| 3,898,882 A | 8/1975 | Prokopius |
| 4,630,689 A | 12/1986 | Galle et al. |
| 7,404,416 B2 | 7/2008 | Schultz et al. |
| 2007/0261486 A1 | 11/2007 | Fallet |
| 2013/0042699 A1 | 2/2013 | Schultz et al. |
| 2017/0159405 A1 | 6/2017 | Hazel |
| 2018/0347348 A1* | 12/2018 | Jaaskelainen ....... E21B 41/0085 |
| 2019/0120048 A1 | 4/2019 | Coffin et al. |
| 2019/0136674 A1* | 5/2019 | Fripp ..................... E21B 43/12 |

FOREIGN PATENT DOCUMENTS

| | | |
|---|---|---|
| CN | 111076780 A | 4/2020 |
| WO | 9642000 A | 12/1996 |
| WO | 2019068166 A1 | 4/2019 |
| WO | 2021025667 A1 | 2/2021 |

OTHER PUBLICATIONS

Foreign Communication from Related Application—International Search Report and Written Opinion of the International Searching Authority, International Application No. PCT/US2022/031578, dated Feb. 14, 2023, 11 pages.

(Continued)

*Primary Examiner* — D. Andrews
(74) *Attorney, Agent, or Firm* — Conley Rose, P.C.; Rodney B. Carroll

(57) ABSTRACT

A downhole energy harvesting apparatus comprising a fluidic oscillator comprising: an inlet channel configured to receive fluid from a wellbore, a feedback system coupled to the inlet channel to oscillate the fluid, and an outlet channel coupled to the feedback system and configured to receive the oscillated fluid from the feedback system, and at least one piezoelectric element disposed on at least one side of the outlet channel and configured to generate an electric signal in response to variations in pressure of the oscillated fluid.

20 Claims, 9 Drawing Sheets

(56) References Cited

OTHER PUBLICATIONS

Electronic Acknowledgment Receipt, Specification and Drawings for International Application No. PCT/US2022/31573, entitled "'Downhole Flow Sensing With Power Harvesting and Flowcontrol,'" filed filed May 31, 2022, 39 pages.
Electronic Acknowledgment Receipt, Specification and Drawings for International Application No. PCT/US2022/31578, entitled "Downhole Flow Sensing With Power Harvesting," filed May 31, 2022, 49 pages.
Filing Receipt, Specification and Drawings for U.S. Appl. No. 17/749,599, entitled "Downhole Flow Sensing With Power Harvesting and Flow Control," filed May 20, 2022, 49 pages.
Foreign Communication from Related Application—International Search Report and Written Opinion of the International Searching Authority, International Application No. PCT/US2022/031573, dated Feb. 15, 2023, 11 pages.
Office Action dated Mar. 14, 2023 (21 pages), U.S. Appl. No. 17/749,599, filed May 20, 2022.

* cited by examiner

US 11,905,800 B2

DOWNHOLE FLOW SENSING WITH POWER HARVESTING

TECHNICAL FIELD

The present application relates generally to downhole operations and, more particularly to downhole energy harvesting and fluid flow sensing in a well during the downhole operations.

BACKGROUND

The current downhole power harvesting approaches may use moving or flexible parts in order to generate energy. The moving parts may tend to wear out and flexible parts (e.g., cantilever designs) may experience fatigue. These moving or flexible parts may tend to have limited service lives and may suffer reliability problems at high and low temperatures. Thus, it is desirable to provide robust and reliable downhole power generation in conjunction with flow measurements in the harsh downhole conditions.

BRIEF DESCRIPTION OF DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
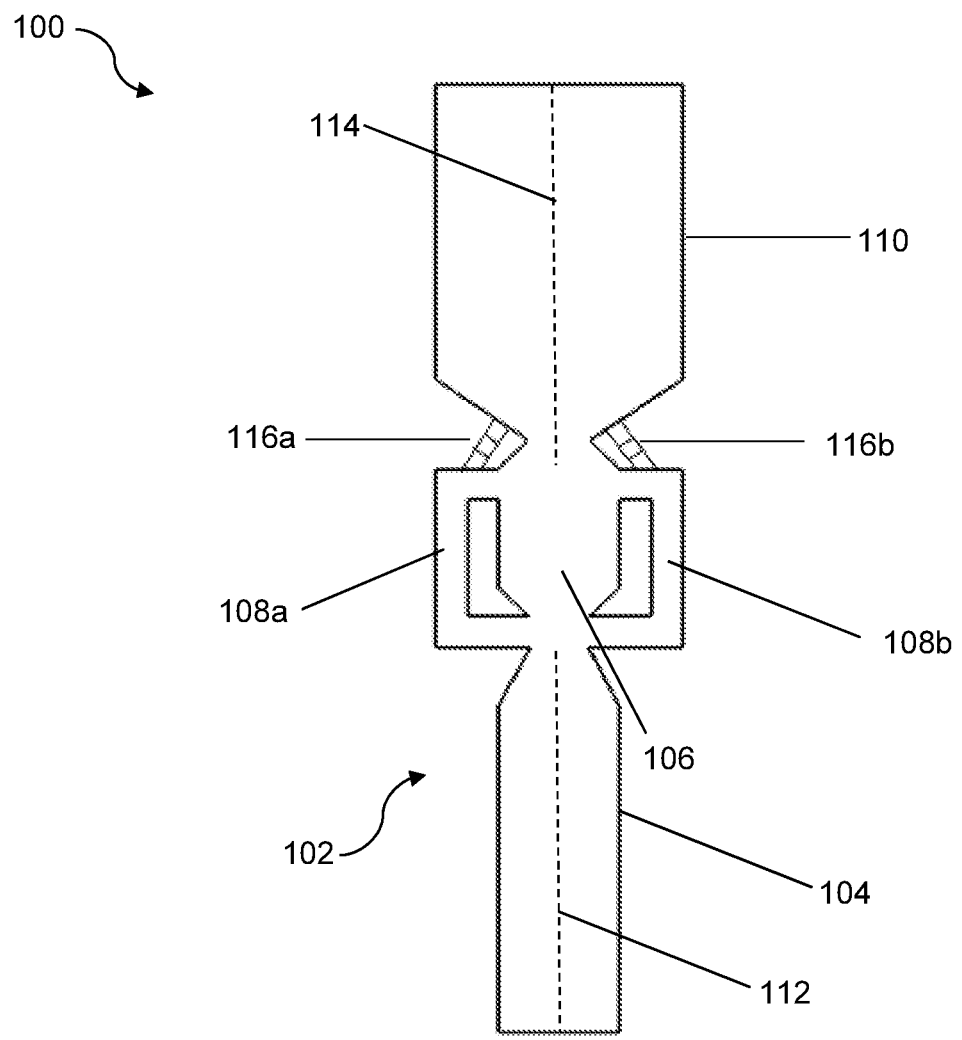
FIG. 1 illustrates a downhole power harvesting apparatus using a symmetric fluidic oscillator and piezoelectric elements, in accordance with embodiments of the present disclosure.

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

The present disclosure generally relates to apparatus and methods for harvesting downhole energy and measuring fluid flow in a downhole environment. In some embodiments, the downhole energy harvesting apparatus may include a fluidic oscillator and a piezoelectric element disposed on the fluidic oscillator. When force/pressure fluctuations/vibrations are experienced in the fluidic oscillator, such as, due to fluid flowing through the fluidic oscillator, the piezoelectric element may convert mechanical strain into an electrical signal(s) or voltage, due to deformation of the piezoelectric element by the fluid flow. The generated electrical signal may be used for power harvesting, flow rate determination, and as an indication of gas presence. In some embodiments, the generated electric signals may be stored to a downhole energy storage device (e.g., a capacitor or a battery) attached to the piezoelectric element to power one or more components of the downhole tools/devices without electrical connection to the surface.

In some embodiments, the piezoelectric element in the fluidic oscillator may pick-up frequency of oscillations induced in the fluidic oscillator. The frequency of oscillations may be used for the flow measurements. The frequency of oscillations may depend on various factors. For example, the frequency of oscillations may be a linear function of the flow rate of the fluid. As the oscillation frequency is linearly proportional to the flow rate, the fluidic oscillator may also be implemented as a flow meter device to determine information relating to the fluid. The information may include a flow rate, a fluid composition, a fluid density, and the like fluid properties. Additionally, or alternatively, the frequency of oscillation of the fluid may depend on pressure drop (e.g., the square root of the pressure drop) in the fluidic oscillator. Thus, the disclosed apparatus may have dual use as an energy harvester and as a flow meter, which is of considerable interest for downhole measurements.

In some embodiments, fluid from the wellbore may travel through a flow meter device (e.g., positioned in the wellbore environment) that includes one or more fluidic oscillators to facilitate single-phase measurements or multi-phase measurements. Each fluidic oscillator in the flow meter may generate an acoustic signal proportional to flow rate and fluid properties of fluid that pass through the corresponding fluidic oscillator.

In some embodiments, the fluidic oscillator may be a symmetric fluidic oscillator or an asymmetric fluidic oscillator. The symmetric fluidic oscillator may include one or more symmetric features or symmetric components. For example, an outlet channel of the symmetric fluidic oscillator is symmetric about an axis, which may be similar or identical to the axis of an inlet channel of the symmetric fluidic oscillator. The asymmetric fluidic oscillator may include one or more asymmetric features or asymmetric components. For example, the outlet channel of the asymmetric fluidic oscillator may be asymmetric about an axis that extends along a direction of fluid flow through the asymmetric fluidic oscillator. Additionally, an asymmetric component (e.g., the outlet channel) of the asymmetric fluidic oscillator may be irregularly shaped. For example, the asymmetric component may be an irregular quadrilateral, triangle, pentagon, and the like. The asymmetry of the fluidic oscillator may facilitate increased vibrations (e.g., increased intensities) or other suitable acoustic signals compared to vibrations or other suitable acoustic signals generated via the symmetric fluidic oscillator with similar fluid. For example, as the fluid oscillates in the asymmetric fluidic oscillator, flow of the fluid may be interrupted or otherwise disrupted. The disrupted flow (e.g., the redirected flow of fluid) may cause pressure waves or other suitable types of acoustic signals to be generated by the asymmetric fluidic oscillator.

In some embodiments, the generated electric/acoustic signals may be detected by sensing devices, such as fiber-optic cables, pressure transducers, hydrophones, geophones, accelerometers, differential pressure gauges, other suitable electrical or optical sensing devices, or any combination thereof via the fluidic oscillator. The detected electric/acoustic signals may be used to determine information, such as density, composition, flow, other suitable information, or any combination thereof, relating to the fluid. For example, the fluidic oscillator may be interrogated via real-time sensing or data collection tools, memory tools, and the like. Data collected via the interrogation may be converted to flow information, for example, at the surface of the wellbore or in other suitable locations.

In some embodiments, the electric signals from the piezoelectric element may be harvested and recorded for flow measurements. Thus, utilizing the electrical signals from the piezoelectric element, without the associated acoustic transmission or Distributed Acoustic Sensing (DAS) fiber for recording, may allow for effective use of the fluidic oscillator flow meter in noisy environments.

Furthermore, the disclosed downhole energy harvester with flow monitoring may be useful in variety of applications such as production monitoring, production control, production optimization, single well application and multi-well application, modelling and simulation, monitoring of single well completion performance, monitoring of multi-well completion performance and interaction, well planning including single well completion design, multi-well completion design, well spacing, training of machine-learning (ML) based models, ML based production optimization control systems, systems and processes for computer based, ML based production control, and/or production optimization.

The disclosed downhole power harvesting approach using a fluidic oscillator with piezoelectric element placed in the fluidic oscillator in such a way that power harvesting can be done by having the fluid motion create force/pressure variations on the piezoelectric element. Because the fluidic oscillator has no-moving parts, it is therefore having advantages of robustness, high reliability, and long lifespan.

The above illustrative examples are given to introduce the reader to the general subject matter discussed herein and are not intended to limit the scope of the disclosed concepts. The following sections describe various additional features and examples with reference to the drawings in which like numerals indicate like elements, and directional descriptions are used to describe the illustrative aspects, but, like the illustrative aspects, should not be used to limit the present disclosure.

FIG. 1 illustrates a downhole power harvesting apparatus 100 using a symmetric fluidic oscillator, in accordance with embodiments of the present disclosure. The downhole power harvesting apparatus may comprise a symmetric fluidic oscillator 102 having an inlet channel 104, a mixing chamber 106, feedback loops 108a-b, and an outlet channel 110. The inlet channel 104 may be coupled to the mixing chamber 106, which may be coupled to the feedback loops 108a-b and the outlet channel 110. The symmetric fluidic oscillator 102 may include other or different suitable components. As illustrated in FIG. 1, the inlet channel 104 is symmetric about axis 112, but the inlet channel 104 may be symmetric about other suitable axes or may be asymmetric. The outlet channel 112 may be symmetric. For example, the outlet channel 112 may be symmetric along any suitable axes of the outlet channel 112. As illustrated, the outlet channel 112 is symmetric about axis 114, which may be similar or identical to the axis 112 of the inlet channel 104.

The downhole power harvesting apparatus 100 may further comprise one or more piezoelectric elements 116a, 116b disposed on at least one side of the outlet channel 110. In some examples, the optimum placement of the piezoelectric elements 116a, 116b may be a function of a) a location that maximized the observed level of pressure variation, b) ease of manufacturing/assembly, and c) durability. The placement of the piezoelectric elements 116a, 116b may take place in one of the areas of the downhole power harvesting apparatus 100 where there is expected to be a variation in pressure due to the oscillation. For example, the feedback channels 108a-b may be suitable locations for the placement to detect the oscillation frequency and to observe pressure variation. In some embodiments, the feedback channels 108a-b may be connected (in the third dimension) by a channel with a piezoelectric element blocking the channel, and thus subject to the differential pressure. This may generate a larger variation in pressure, more signal, and more energy.

In some embodiments, the one or more piezoelectric elements 116a, 116b may be disposed on both sides of the outlet channel 110 to generate twice the power output. For example, piezoelectric electrical output may be placed in a push-pull type arrangement when the piezoelectric elements 116a, 116b used on both arms of the symmetric fluidic oscillator 102, to generate twice the power output. In some examples, the one or more piezoelectric elements 116a, 116b may comprise a piezoelectric film, a piezoelectric ceramic, a piezoelectric crystalline material, and a piezoelectric fiber-composite material.

The piezoelectric elements 116a, 116b may comprise high flexible elements. The piezoelectric elements 116a, 116b may be configured to deform and generate electrical currents when placed under pressures. For example, the piezoelectric elements 116a, 116b may use piezoelectric effect to measure changes in pressure, acceleration, temperature, strain, or force in flow through the symmetric fluidic oscillator 102 and convert them to an electrical signal(s). In some embodiments, the piezoelectric elements 116a, 116b may be further coupled to a charging circuit and a downhole energy storage device to store the electric signal. The downhole energy storage may include a battery or a capacitor configured to power downhole devices such as a memory tool, an acoustic sensor, a pressure sensor, a hydrophone, an accelerometer, a vibration sensor, a strain sensor, a capacitance sensor, a resistance sensor, and/or a transducer. The generated electrical signals may be used for power harvesting, flow rate determination, and an indication of gas presence.

As shown in FIG. 1, fluid may be directed into the symmetric fluidic oscillator 102 via the inlet channel 104. The fluid may travel into the mixing chamber 106, and the fluid may oscillate (e.g., in the mixing chamber 106, by traveling through one or more of the feedback loops 108a-b, by flowing through the outlet channel 112, etc.). The piezoelectric elements 116a, 116b in the symmetric fluidic oscillator 102 may pick-up frequency of oscillations induced in the symmetric fluidic oscillator for the flow measurements. The frequency of oscillation of the fluid may depend on various factors. For example, the frequency of oscillation of the fluid may be a linear function of the flow rate of the fluid. Additionally, or alternatively, the frequency of oscillation of the fluid may depend on pressure drop (e.g., the square root of the pressure drop) in the symmetric fluidic oscillator 102. The frequency of oscillation may depend on other suitable factors relating to the symmetric fluidic oscillator 102. In some examples, the oscillation of the fluid in the symmetric fluidic oscillator 102 may cause acoustic signals to be generated.

In some cases, the acoustic signals generated from the symmetric fluidic oscillator 102 may not include an intensity large enough to be detected with respect to the wellbore. Accordingly, the fluidic oscillator may be asymmetric to generate acoustic signals with increased intensity compared to the other fluidic oscillators.

Figure 2:
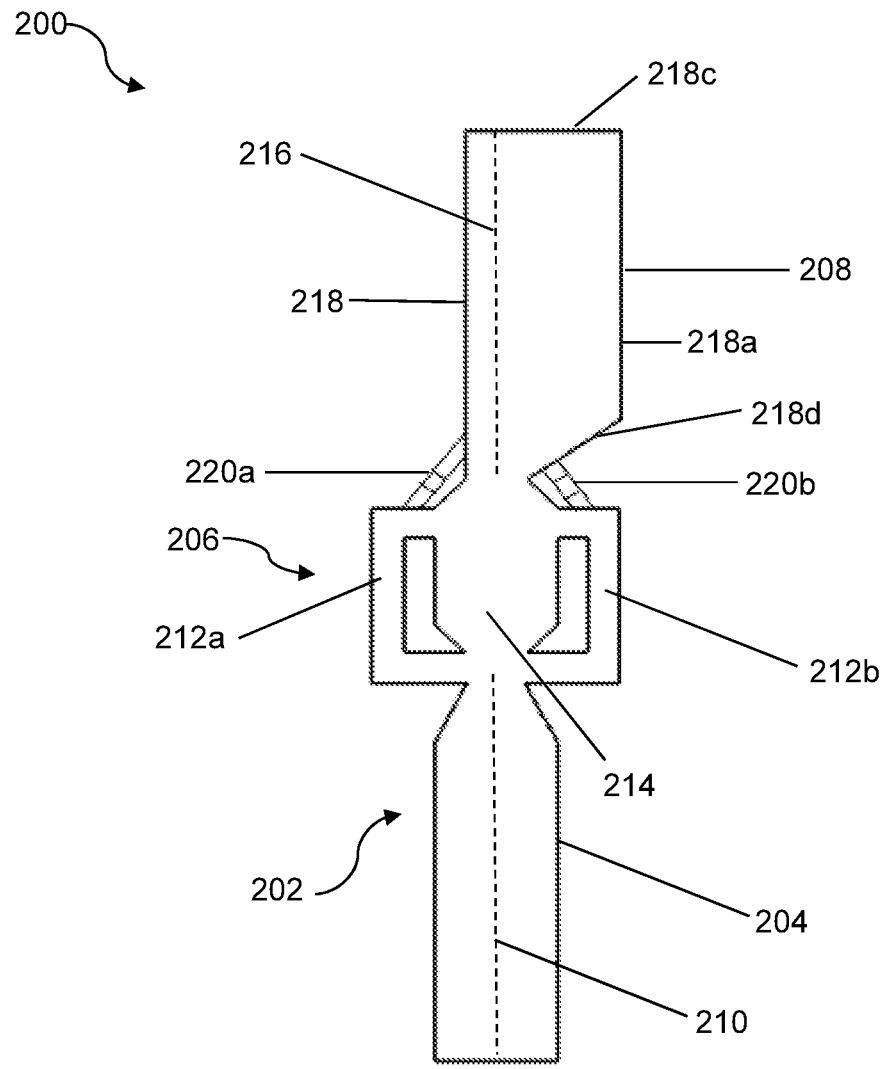
FIG. 2 illustrates a downhole power harvesting apparatus using an asymmetric fluidic oscillator and piezoelectric elements, in accordance with embodiments of the present disclosure.

FIG. 2 illustrates a downhole power harvesting apparatus 200 using an asymmetric fluidic oscillator, in accordance with embodiments of the present disclosure. The asymmetric fluidic oscillator 202 may include an inlet channel 204, a feedback system 206, an outlet channel 208, and any other suitable components. The inlet channel 204 may include a receiving path in the asymmetric fluidic oscillator 202. For example, the inlet channel 204 may receive fluid (e.g., from the casing or other suitable components of a wellbore) that may originate upstream from the asymmetric fluidic oscillator 202, and the inlet channel 204 may direct the fluid further into the asymmetric fluidic oscillator 202 such as into the feedback system 206. The inlet channel 204 may be symmetric or asymmetric. As illustrated in FIG. 2, the inlet channel 204 is symmetric about axis 210, but the inlet channel 204 may be symmetric about other suitable axes or may be asymmetric.

As illustrated, the feedback system 206 may be coupled (e.g., mechanically) to the inlet channel 204 and the outlet channel 208. Additionally or alternatively, the feedback system 206 may be coupled to other suitable components of the asymmetric fluidic oscillator 202. As illustrated, the feedback system 206 may include a first feedback loop 212a, a second feedback loop 212b, and a mixing chamber 214. The feedback system 206 may include any other suitable components and may be otherwise suitable shaped or configured. For example, the feedback system 206 may include more or fewer feedback loops (212a, 212b), a differently sized or shaped mixing chamber 214, differently shaped or sized feedback loops 212, etc. for oscillating the fluid.

The outlet channel 208 may be coupled (e.g., mechanically) to the feedback system 206. For example, the outlet channel 208 may be coupled to the feedback loops 212a-b, the mixing chamber 214, to other suitable components, or to any suitable combination thereof. The outlet channel 208 may define an exit path for fluid received from the feedback system 206. For example, fluid may be received from the feedback system 206 by the outlet channel 208, and the outlet channel 208 may direct the fluid out (e.g., into the casing of the wellbore or other suitable component thereof) of the asymmetric fluidic oscillator 202.

As shown in FIG. 2, the outlet channel 208 may be asymmetric. For example, the outlet channel 208 may not be symmetric along any suitable axes of the outlet channel 208. As illustrated, the outlet channel 208 is not symmetric about axis 216, which may be similar or identical to the axis 210 of the inlet channel 204. The asymmetric nature of the outlet channel 208 may cause disruptions or other suitable variations in the flow of fluid that passes through the outlet channel 208. For example, the asymmetry of the outlet channel 208 may interrupt the natural flow of the fluid, and the interruption may cause vibrations or other suitable acoustic signals that may be larger or that otherwise may include higher intensities than signals produced from symmetric fluidic oscillators.

As illustrated in FIG. 2, the outlet channel 208 is an irregularly shaped quadrilateral. But, the outlet channel 208 may be or otherwise include any other suitable irregular or asymmetric shapes (e.g., an irregular pentagon, a regular quadrilateral having jagged edges, etc.). The outlet channel 208 may include a right side 218a, a left side 218b, a top side 218c, and a bottom side 218d. The right side 218a may be connected to the bottom side 218d and to the top side 218c, the left side 218b may be connected to the top side 218c and to the feedback system 206, and the bottom side 218d may be connected to the feedback system 206. The right side 218a and the left side 218b may be substantially parallel to one another. In other examples, the right side 218a and the left side 218b may be non-parallel. Additionally, the top side 218c and the bottom side 218d may be non-parallel for forming the asymmetric feature of the outlet channel 208. In some examples, the asymmetric feature may be formed via the bottom side 218d coupling to the feedback system 206 in a first location, while the left side 218b is coupled in a second location to the feedback system 206. Accordingly, the right side 218a may be shorter than the left side 218b, and the bottom side 218d may include a defined and non-zero slope.

Fluid received by the inlet channel 204 may be directed to the feedback system 206. For example, the inlet channel 204 may receive produced fluid from the wellbore and may direct the produced fluid to the feedback system 206. The produced fluid may enter the feedback system 206 (e.g., via the feedback loops 212a-b, the mixing chamber 214, or a combination thereof) and may oscillate or otherwise suitably flow. For example, the produced fluid may travel through the first feedback loop 212a or the second feedback loop 212b and into the mixing chamber 214 (e.g., via one or more iterations). The produced fluid may be directed into the outlet channel 208.

The downhole power harvesting apparatus 200 may further comprise one or more piezoelectric elements 220a, 220b disposed on at least one side of the outlet channel 208. In some embodiments, a single piezoelectric element (220a or 220b) may be subject to differential pressure. For example, the piezoelectric element may be located in a new channel with a piezoelectric element blocking the channel and connecting two sites such as the feedback loops 212a-b, and thus subject to differential (push/pull) pressure disturbance to generate twice the power output or the observed force/disturbance.

In some embodiments, the one or more piezoelectric elements 220a, 220b may be disposed on both sides of the outlet channel 208. The piezoelectric elements 220a, 220b may generate electrical currents when placed under pressures. The piezoelectric elements 220a, 220b may be engaged with asymmetric fluidic oscillator 202 in such a way that the piezoelectric element generates electric power in response to variations in fluid pressure/frequency of fluctuations in flow through the asymmetric fluidic oscillator 202. Piezoelectric electrical output may be placed in a push-pull type arrangement when used on both arms of the asymmetric fluidic oscillator 202, to generate twice the power output.

The asymmetric nature of outlet channel 208 may cause disruption of flow of the produced fluid through the outlet channel 208. The disruption may propagate from the outlet channel 208 to the feedback system 206 or to other suitable components of the asymmetric fluidic oscillator 202 or of the wellbore. The disruption in the flow of the produced fluid may cause vibrations and the piezoelectric elements 220a, 220b may generate electrical currents when placed under pressures. The electric signals generated via the disruption may include a periodicity that is different than non-disrupted flow and may include an intensity that is higher than an intensity of signals generated via symmetric fluidic oscillators or other types of acoustic devices.

In some embodiments, the piezoelectric elements 220a, 220b in the asymmetric fluidic oscillator may pick-up frequency of oscillations induced in the asymmetric fluidic oscillator 202 for the flow measurements. The frequency of oscillation of the fluid may depend on various factors. For example, the frequency of oscillation of the fluid may be a linear function of the flow rate of the fluid. Additionally or alternatively, the frequency of oscillation of the fluid may depend on pressure drop (e.g., the square root of the pressure drop) in the asymmetric fluidic oscillator 202. The frequency of oscillation may depend on other suitable factors relating to the asymmetric fluidic oscillator 202.

In some embodiments, the asymmetric fluidic oscillator 202 may be included in a flow meter device and may cause acoustic signals to be generated via oscillating fluid flow in the asymmetric fluidic oscillator 202.

Figure 3:
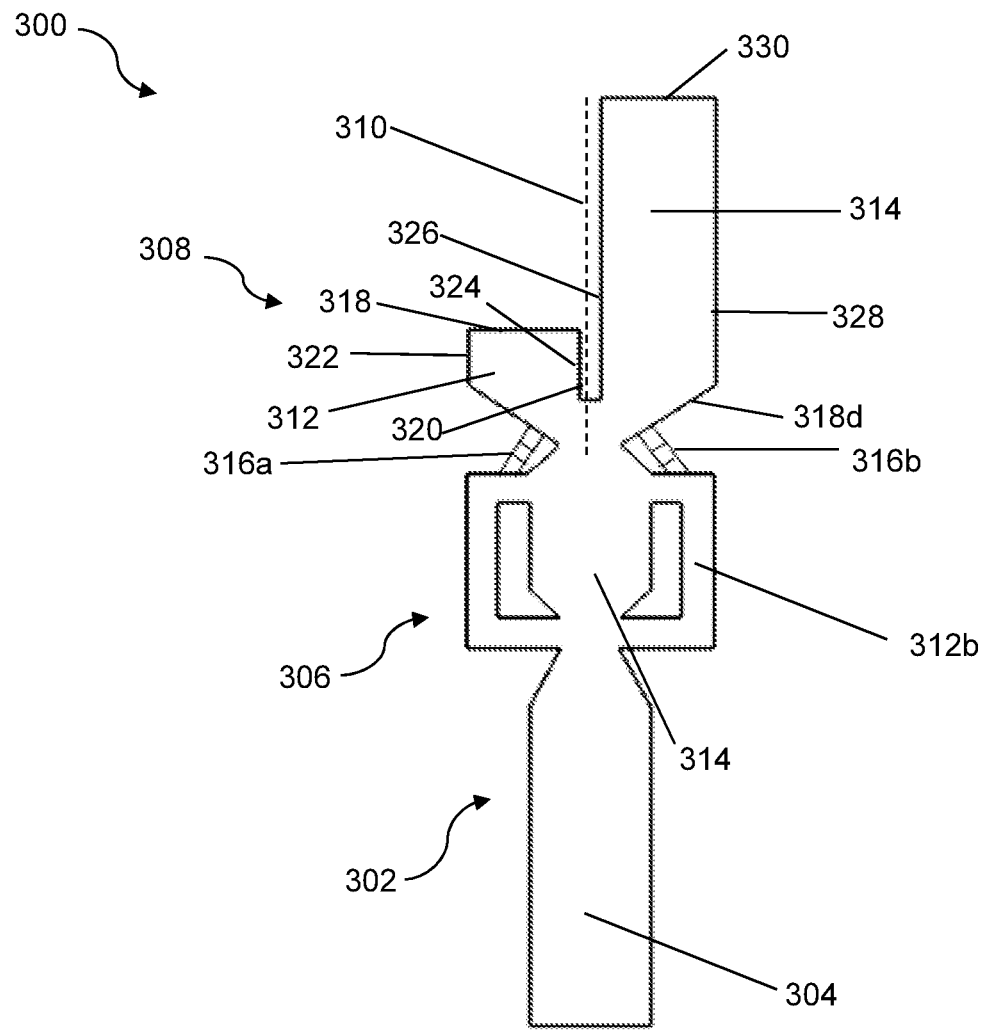
FIG. 3 illustrates another downhole power harvesting apparatus using an asymmetric fluidic oscillator and piezoelectric elements, in accordance with embodiments of the present disclosure.

FIG. 3 illustrates another downhole power harvesting apparatus 300 using an asymmetric fluidic oscillator, in accordance with embodiments of the present disclosure. The asymmetric fluidic oscillator 302 may include an inlet channel 304, a feedback system 306, and an outlet channel 308. As illustrated, the inlet channel 304 is similar to the inlet channel 204, and the feedback system 306 is similar to the feedback system 206. But, the inlet channel 304, the feedback system 306, or a combination thereof may differ from corresponding features of the asymmetric fluidic oscillator 302. The asymmetric fluidic oscillator 302 may be included in the flow meter device and may cause acoustic signals to be generated via oscillating fluid flow in the asymmetric fluidic oscillator 302.

The inlet channel 304 may be coupled (e.g., mechanically) to the feedback system 306, which may, in turn, be coupled to the outlet channel 308. The outlet channel 308 may be asymmetric. For example, the outlet channel 308 may not include any axes about which the outlet channel 308 is symmetric. In some examples, the outlet channel 308 may be asymmetric about axis 310, which may extend along a flow direction of fluid through the asymmetric fluidic oscillator 302.

The outlet channel 308 may include a first portion 312 and a second portion 314 and, optionally, other portions for disrupting flow of fluid through the asymmetric fluidic oscillator 302 to generate acoustic signals. The first portion 312 may be coupled (e.g., mechanically) to the feedback system 306 at a first location on which a first piezoelectric element 316a may be disposed, and the second portion 314 may be coupled to the feedback system 306 at a second location on which a second piezoelectric element 316b may be disposed, which may be different than the first location. The second portion 314 may allow flow of fluid through the asymmetric fluidic oscillator 302. But, the first portion 312 may not allow flow of fluid through the asymmetric fluidic oscillator 302. For example, the first portion 312 may include a cap 318 or may otherwise be blocked so that fluid may not exit through the outlet channel 308 via the first portion 312. Accordingly, fluid flow through the outlet channel 308 may be disrupted, and vibrations or acoustic signals may be generated based on the disrupted flow of the fluid.

As illustrated, the outlet channel 308 includes the first portion 312 and the second portion 314 that are separated by buffer 320. The first portion 312 and the second portion 314 may include differing measurements or features. For example, a left side 322 of the first portion 312 and a right side 324 of the first portion 312 may be shorter or otherwise smaller than a left side 326 of the second portion 314 and the right side 328 of the second portion 314, respectively. Additionally, the cap 318 of the first portion may restrict or otherwise prevent flow of fluid through the outlet channel 308 via the first portion 312, while a top 330 of the second portion 314 may be open or otherwise allow flow of the fluid through the outlet channel 308 via the second portion 314. In some examples, the first portion 312 may allow flow, while the second portion 314 restricts or obstructs the flow. The outlet channel 308 may include other suitable amounts of portions, which may include other suitable features or measurements, with sufficient asymmetry to produce the acoustic signals.

The downhole power harvesting apparatus 300 may further comprise one or more piezoelectric elements 316a, 316b disposed on at least one side of the outlet channel 308. In some embodiments, the one or more piezoelectric elements 316a, 316b may be disposed on both sides of the outlet channel 308. The piezoelectric elements 316a, 316b may generate electrical currents due to deformation by the pressure disturbance. The deformation of the piezoelectric elements 316a, 316b may generate the current or power. In some cases, there may be an elastic deformation (e.g., compression of the material) when there is a pressure variation. In some cases, to increase the level of deformation the piezoelectric elements may comprise a hollow section which could be, for example a shallow cavity behind the piezoelectric element, or a cavity manufactured within the piezoelectric element which is then assemble in the void where it to be located.

In some examples, the piezoelectric material (e.g., piezoelectric crystal) may be manufactured by deposition (e.g., vapor deposition or deposition from an aqueous solution). In some examples, during manufacturing, a piezoelectric element may be disposed by direct deposition/growth of the material on the surface of interest. Other option may include manufacturing of a separate part (e.g., separate sub-assembly), then the insertion of assembly of the parts on the device.

The piezoelectric elements 316a, 316b may be engaged with asymmetric fluidic oscillator 302 in such a way that the piezoelectric element generates electric power in response to variations in fluid pressure/frequency of fluctuations in flow through the asymmetric fluidic oscillator 302. Piezoelectric electrical output may be placed in a push-pull type arrangement when used on both arms of the asymmetric fluidic oscillator 302, to generate twice the power output.

The asymmetric nature of outlet channel 308 may cause disruption of flow of the produced fluid through the outlet channel 308. The disruption may propagate from the outlet channel 308 to the feedback system 306 or to other suitable components of the asymmetric fluidic oscillator 302 or of the wellbore. The disruption in the flow of the produced fluid may cause vibrations and the piezoelectric elements 316a, 316b may generate electrical currents when placed under pressures.

Figure 4:
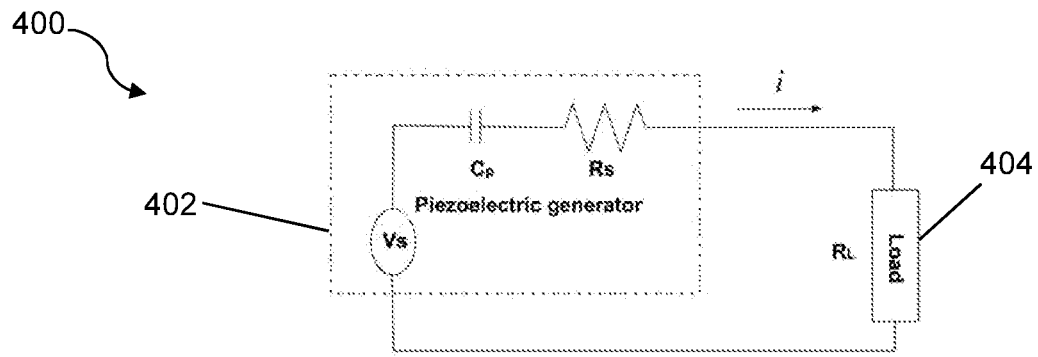
FIG. 4 illustrates a circuit for a piezoelectric generator connected with a resistive load, in accordance with embodiments of the present disclosure.

FIG. 4 illustrates a circuit 400 for a piezoelectric generator connected with a resistive load, in accordance with embodiments of the present disclosure. The circuit 400 may comprise a piezoelectric generator 402 connected with a resistive load 404. The piezoelectric generator 402 may utilize pressure fluctuations/vibrations to excite the piezoelectric elements, thereby producing an electric signal/alternating voltage, or AC power, where it may be exploited to charge a capacitor or the resistive load 404.

Figure 5:
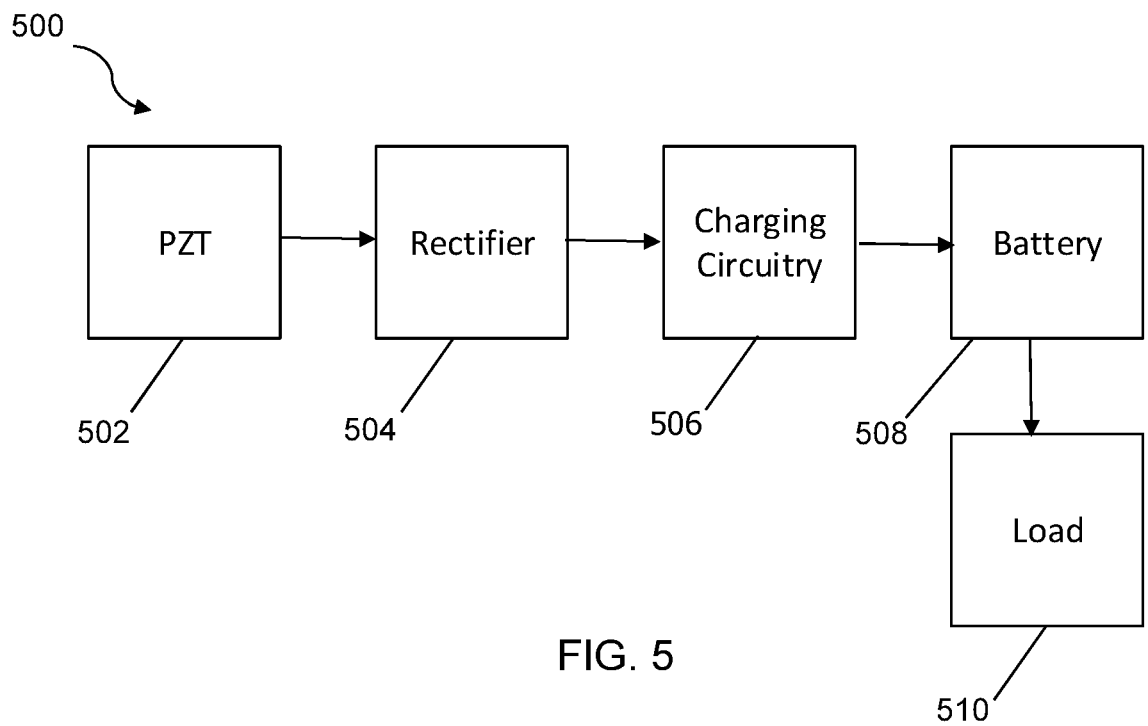
FIG. 5 illustrates a block diagram of a piezoelectric harvester connected with electronic circuitry, in accordance with embodiments of the present disclosure.

FIG. 5 illustrates a block diagram 500 of a piezoelectric generator connected with electronic circuitry, in accordance with embodiments of the present disclosure. The piezoelectric generator may capture pressure vibrations caused by the fluid flowing in the fluidic oscillator and convert this input mechanical energy into electric energy (AC power). The AC power produced by the piezoelectric generator 502 may be conditioned before it may be used with any electronics or storage elements requiring DC power. Thus, the piezoelectric generator 502 may be coupled with a rectifier 504 for rectification (AC/DC conversion). Then, the rectifier may be coupled to the charging circuitry 506, which may be further configured to a downhole energy storage device such as a battery 508, a capacitor, or a load 510 to store the generated energy. The stored energy from the battery may be used to power downhole tools such as downhole tools/devices, sensors, active transducers, a memory tool for retrievable measurements, or a transducer to acoustically transmit the acquired data.

It may be beneficial to only activate the load 510 based on pre-configured intervals in order to manage the available power. It may be similarly beneficial to only activate the transducers to communicate sensed data if/when measured data exceeds predefined deviations from a baseline/measured values. It may be preferred to limit transmission as the power consumption during transmission is high when compared with the power required during sensing/data acquisition and data storage.

In some embodiments, the downhole power generator may power a periodic acoustic sensor and/or pressure sensor that may be used to measure, e.g., signal propagation upstream/downstream of the device to enable doppler shift measurements for bulk flow determination and/or speed of sound measurements for gas/liquid ratio determination. The acoustic transmission may be initiated by a surface generated pressure pulse traveling down the wellbore where the pressure pulse is detected using the pressure sensor in the subsurface sensing module. The downhole generated acoustic/pressure pulse may be tracked using the installed DAS cable and associated DAS interrogator. In some embodiments, the downhole power harvester may use the generated power for additional measurements like e.g., pressure, temperature, vibration (accelerometers, geophones), and the data from one or more of the sensors may be acoustically communicated.

Figure 6:
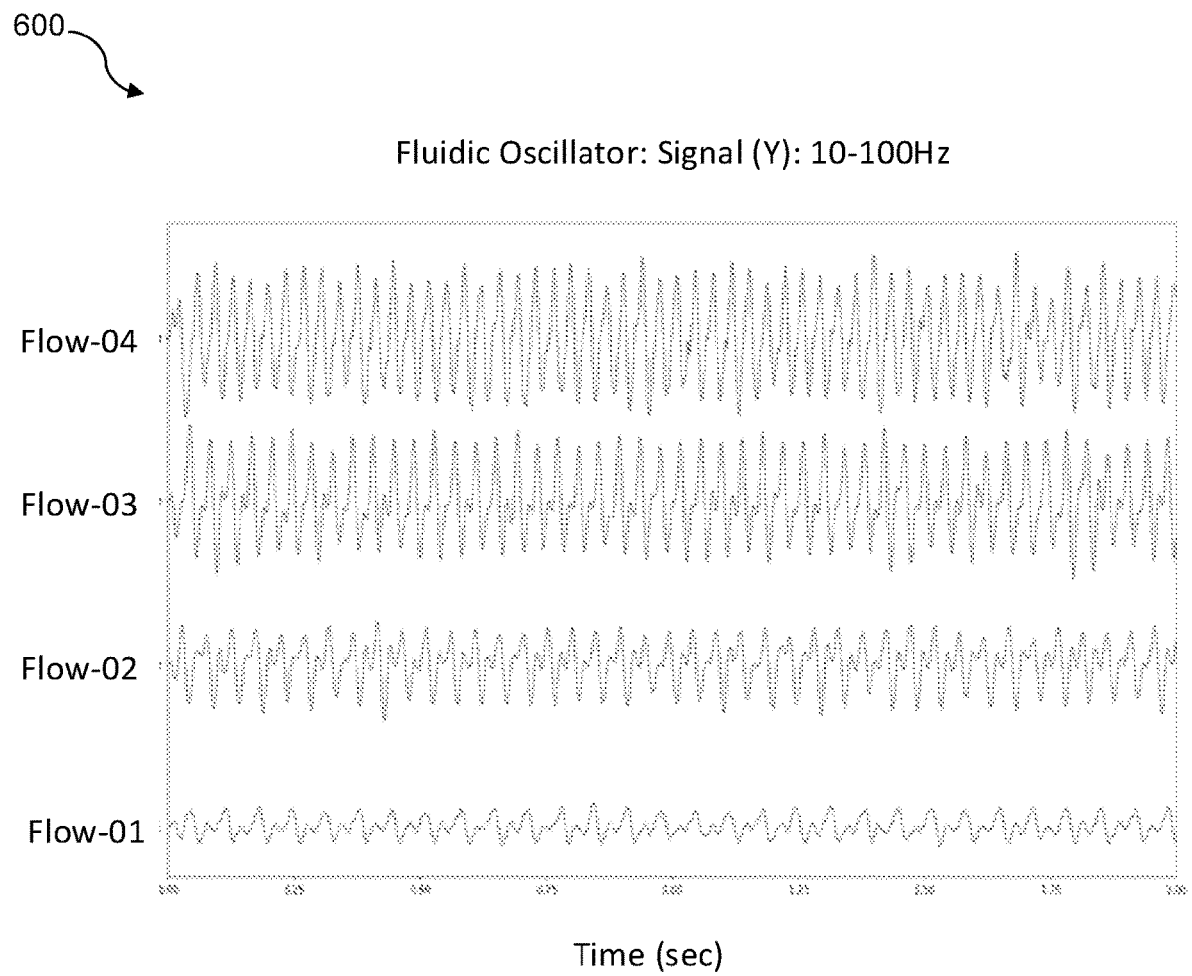
FIG. 6 illustrates a graph between frequency of oscillation and flow rate, in accordance with embodiments of the present disclosure.

FIG. 6 illustrates a graph between frequency of oscillation and flow rate using the fluidic oscillator, in accordance with embodiments of the present disclosure. Fluid may be directed into the fluidic oscillator via the inlet channel. The fluid may travel into the mixing chamber, and the fluid may oscillate (e.g., in the mixing chamber by traveling through one or more of the feedback loops, by flowing through the outlet channel, etc.). The frequency of oscillation of the fluid may depend on various factors. For example, the frequency of oscillation of the fluid may be a linear function of the flow rate of the fluid. Additionally or alternatively, the frequency of oscillation of the fluid may depend on pressure drop (e.g., the square root of the pressure drop) in the fluidic oscillator. The frequency of oscillation may depend on other suitable factors relating to the fluidic oscillator. In some examples, the oscillation of the fluid in the fluidic oscillator may cause acoustic signals to be generated. In some examples, the generated electric signal by piezoelectric signal may be proportional to flow rate and fluid properties of fluid that pass through the fluidic oscillator. Thus, analysis of the acoustic/electric signals in the fluid column may be performed and may be used to determine information (e.g., a fluid type, a flow rate, a fluid composition, a fluid density, and the like) relating to the fluid.

Figure 7:
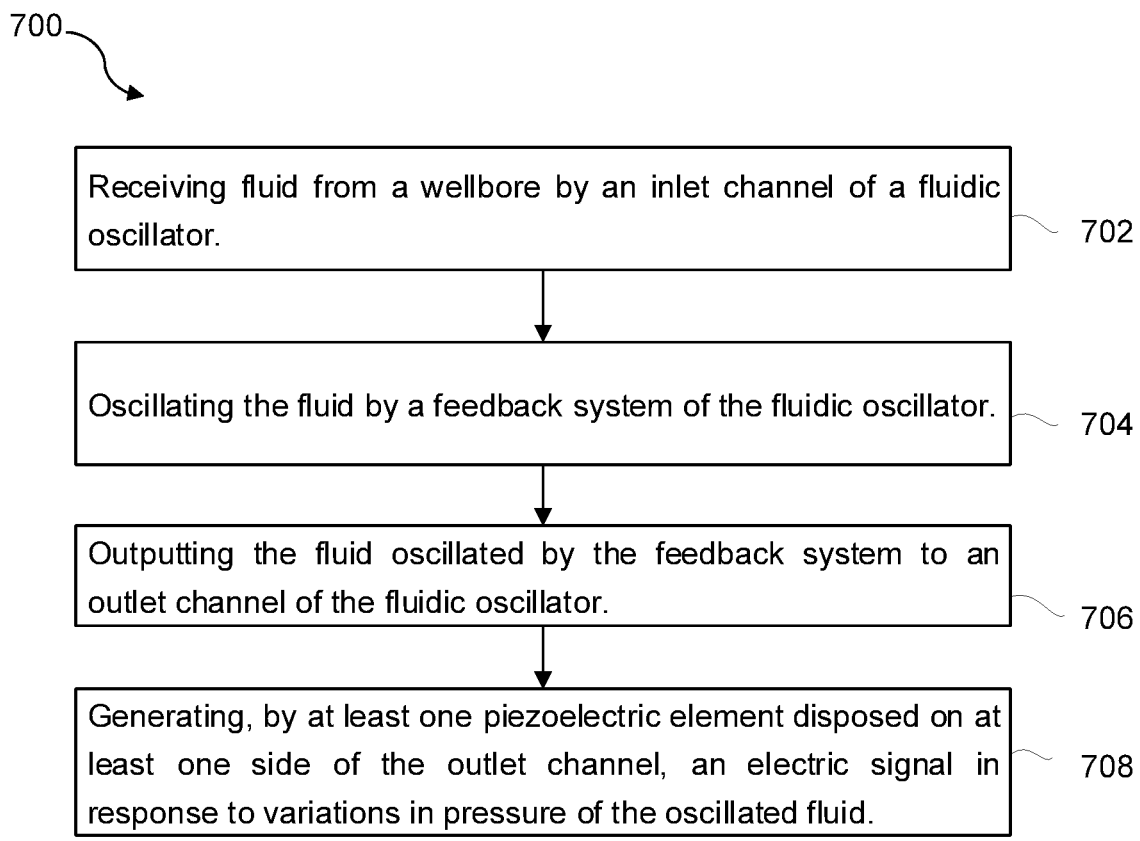
FIG. 7 illustrates is a flow chart of a process for generating an electric signal using a downhole power harvesting apparatus, in accordance with embodiments of the present disclosure.

FIG. 7 illustrates is a flow chart of a process for generating electric signals using a downhole power harvesting apparatus, in accordance with embodiments of the present disclosure. The method may begin at step 702 comprising receiving fluid from a wellbore by an inlet channel of a fluidic oscillator. The fluidic oscillator may comprise a symmetric fluidic oscillator or an asymmetric fluidic oscillator. The asymmetric fluidic may include an asymmetry along an axis oriented in a direction of flow of the fluid through the fluidic oscillator.

Step 704 may comprise oscillating the fluid by a feedback system of the fluidic oscillator. Step 706 may comprise outputting the fluid oscillated by the feedback system to an outlet channel of the fluidic oscillator. Step 710 may comprise generating, by at least one piezoelectric element disposed on at least one side of the outlet channel, an electric signal in response to variations in pressure of the oscillated fluid. The at least one piezoelectric element comprises a piezoelectric film, a piezoelectric ceramic, a piezoelectric crystalline material, and a piezoelectric fiber-composite material, and wherein the at least one piezoelectric element comprises a plurality of piezoelectric elements. In some embodiments, the method further comprises storing the electric signal in a downhole energy storage device coupled to the at least one piezoelectric element, wherein the downhole energy storage device comprises a capacitor or a battery configured to power downhole devices such as a memory tool, an acoustic sensor, a pressure sensor, a hydrophone, an accelerometer, a vibration sensor, a strain sensor, a capacitance sensor, a resistance sensor, and/or a transducer.

Figure 8:
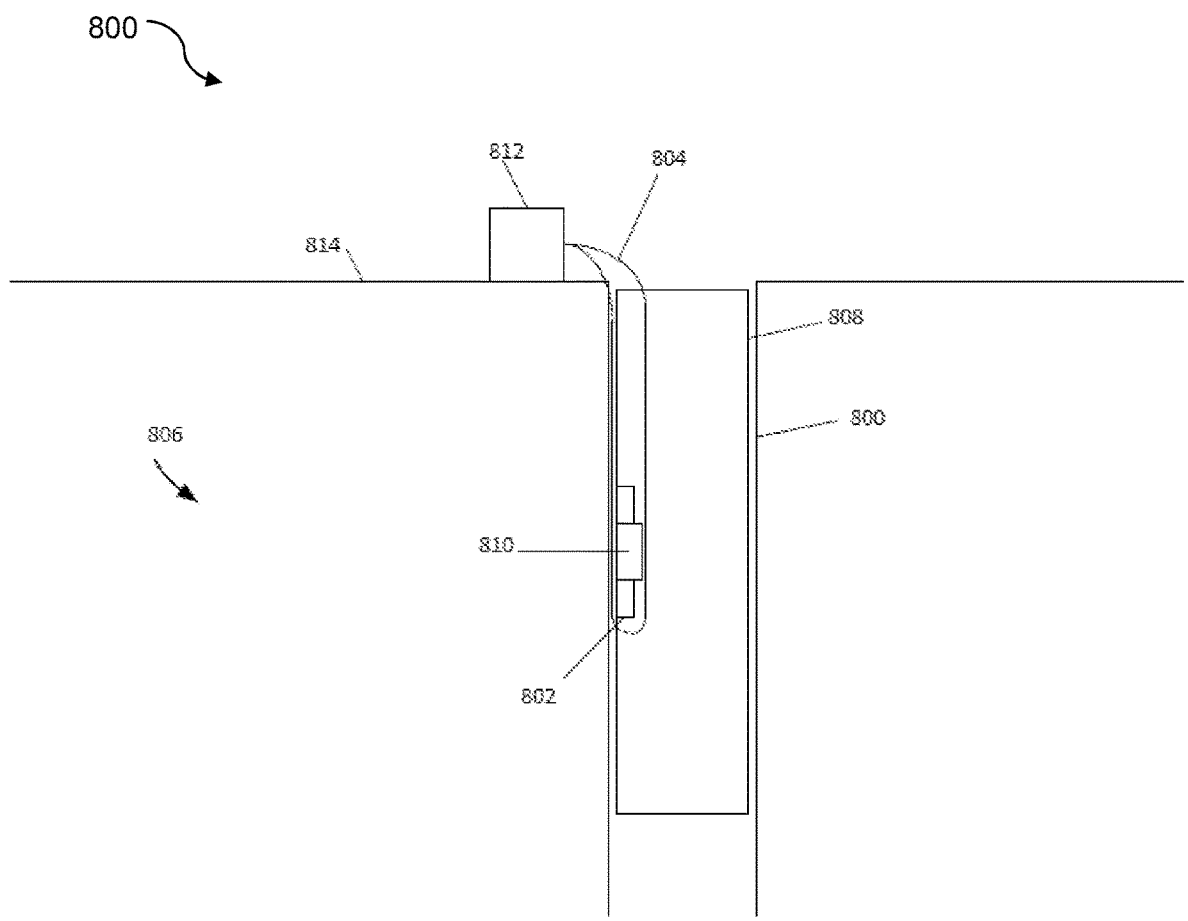
FIG. 8 illustrates a diagram of a wellbore including a surface flow line that includes at least one flow meter device that includes a fluidic oscillator, in accordance with embodiments of the present disclosure.

FIG. 8 illustrates a diagram of a wellbore including a surface flow line that includes at least one flow meter device that includes a fluidic oscillator, in accordance with embodiments of the present disclosure. FIG. 8 is a diagram of a wellbore 800 that includes a flow meter device 802 and a measurement device 804 according to one example of the present disclosure. As illustrated, the wellbore 800 is formed in a subterranean formation 806, but the wellbore 800 may be formed in a sub-oceanic formation or in other suitable locations. As illustrated, the wellbore 800 includes a casing 808, but the wellbore 800 may include a tubing string or other suitable components that facilitate one or more wellbore operations with respect to the wellbore 800. The wellbore 800 may be used to produce fluid from the subterranean formation 806. For example, the wellbore 800 may be used to extract water, oil, gas, other suitable fluid or material, or any combination thereof from the subterranean formation 806.

The flow meter device 802 may be positioned in the wellbore 800. For example, the flow meter device 802 may be affixed to tubing, the casing 808, or any other tubular object of the wellbore 800. The flow meter device 802 may be positioned in any other suitable location (e.g., at the surface, etc.) with respect to the wellbore 800 for measuring properties related to the fluid produced from the wellbore 800. The fluid may travel through the flow meter device 802, and the flow meter device 802 may generate, or otherwise facilitate any sub-component to generate, acoustic waves.

In some examples, the flow meter device 802 may include an acoustic device 810. The acoustic device 810 may include a fluidic oscillator, a hole-turn whistle, and the like. In some examples, the acoustic device 810 may be a symmetric fluidic oscillator or an asymmetric fluidic oscillator. In case of the asymmetric fluidic oscillator, at least one component (e.g., an inlet channel, an outlet channel, a feedback system, etc.) of the asymmetric fluidic oscillator may be asymmetric. The asymmetry of the fluidic oscillator may cause larger, or otherwise easier-to-detect, acoustic waves (compared to waves generated by other acoustic devices) to be generated by the flow of similar fluids.

The flow meter device 802 may include one or more acoustic devices 810 such as the fluidic oscillator to facilitate single-phase measurements or multi-phase measurements. The fluid from the wellbore 800 may include a single-phase fluid or a multi-phase fluid. For example, the fluid from the wellbore 800 may include oil, water, gas, other suitable material, or any suitable combination thereof. For example, the flow meter device 802 may include one, two, three, four, or more fluidic oscillators. A first fluidic oscillator may be positioned in a first location in the flow meter device 802, a second fluidic oscillator may be positioned in a second location in the flow meter device 802, and a third fluidic oscillator may be positioned in a third location in the flow meter device 802. Each of the fluidic oscillators may be used to make measurements for different phases of the fluid. For example, the first fluidic oscillator may be positioned with respect to the flow meter device to measure the water phase of the fluid, the second fluidic oscillator may be positioned with respect to the flow meter device to measure the oil phase of the fluid, etc. The fluidic oscillators may be otherwise suitably positioned for facilitating multi-phase measurements of the fluid. Additionally, different amounts (e.g., more, such as four, five, six, etc., or fewer, such as one or two).

In some embodiments, the flow meter device 802 may include an amount of fluidic oscillators corresponding to an amount of phases included or expected to be in fluid produced via the wellbore 800. For example, if the fluid includes or is expected to include three phases corresponding to oil, gas, and water, then the flow meter device 802 may include three fluidic oscillators to perform a multi-phase measurement of the fluid. In such an example, the three fluidic oscillators may be positioned in different locations (e.g., around a circumference of the flow meter device 802, etc.) with respect to the flow meter device 802. The three different flow meter devices may be positioned a minimum distance apart and each may include a different fluidic oscillator for measuring a different phase of the fluid.

The measurement device 804 may be used to detect the acoustic signals emitted from or generated by the flow meter device 802. As illustrated, the measurement device 804 is a fiber-optic cable, but other types of measurement devices 804, such as pressure transducers and the like, are possible. The measurement device 804 may be communicatively coupled to a detection system 812. The detection system 812 may be positioned at a surface 814 of the wellbore 800 or in other suitable locations (e.g., in the wellbore 800, remote from the wellbore 800, etc.) with respect to the wellbore 800. The measurement device 804 may be connected to the detection system 812 via a wired connection, a wireless connection, or a combination thereof. In some examples, the detection system 812 may include a DAS system, a computing system (e.g., a processor) configured to receive, record, or analyze the acoustic signals, other suitable detection systems, or any combination thereof.

Fluid produced via the wellbore 800 may travel or may otherwise be forced or directed through the flow meter device 802 that includes the acoustic device 810 (e.g., the asymmetric fluidic oscillator). The fluid may oscillate in the asymmetric fluidic oscillator, which may generate or propagate acoustic signals. The acoustic signals may be detected using the measurement device 804, which may capture the acoustic signals and transmit a subsequent signal to the detection system 812. The signals may be used by the detection system 812, or other suitable component or computing system, to determine information relating to the fluid. The information may include a flow rate, a fluid composition, a fluid density, and the like.

Figure 9A:
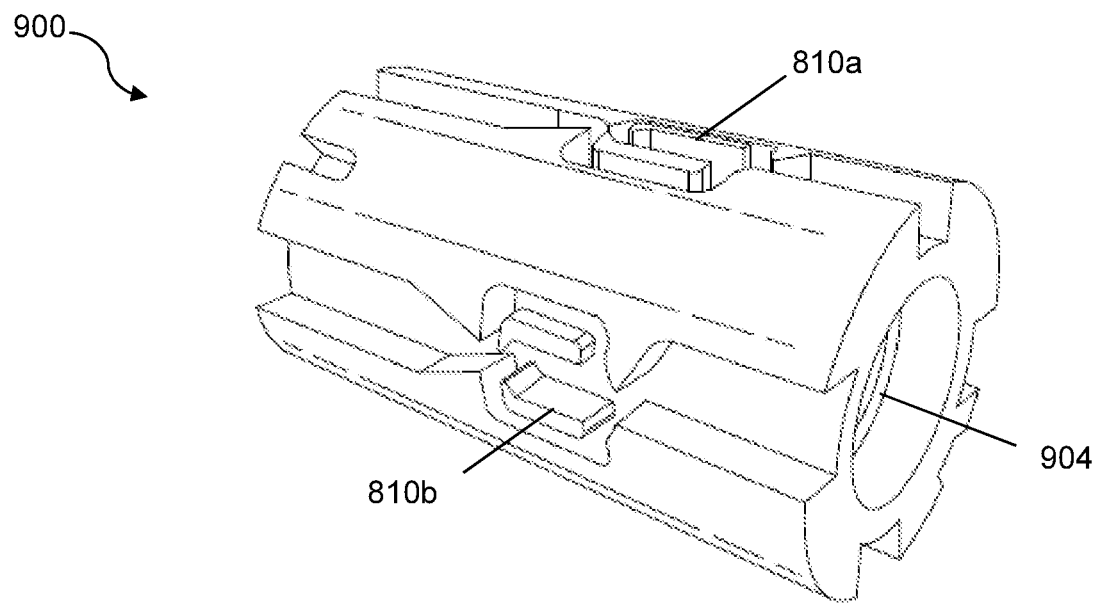
FIGS. 9A-9B illustrate perspective views of a flow meter device, in accordance with embodiments of the present disclosure.
Figure 9B:
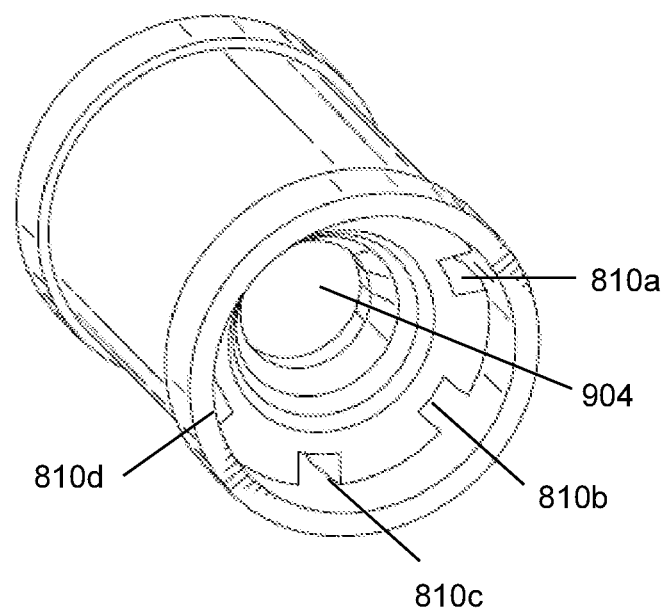

FIGS. 9A-9B illustrate perspective views 900 of a flow meter device, in accordance with embodiments of the present disclosure. The flow meter device 802 may be positioned in the wellbore 800, at the surface 814 of the wellbore 800, or in other suitable locations. In some examples, the flow meter device 802 may be positioned in the casing 808 or other suitable flow line of the wellbore 800. The flow meter device 802 may be used to determine flow rate and other information relating to fluid flowing with respect to the wellbore 800.

As shown in FIG. 9A, the flow meter device 802 may include a set of acoustic devices 810a-b such as the fluidic oscillator, and a bore hole 904. The fluidic oscillator 810-b may comprise asymmetric fluidic oscillator. As shown in FIG. 9A, manufacturing and assembly of the flow meter device 802 may be illustrated. The channels may be located on the outside of a cylinder relates to a) a part that may be manufactured by CNC machining from a cylinder of steel, and b) a part that is in the shape of a cylinder for insertion in a well-bore or pipe.

The component depicted in FIG. 9A may be the central component in the assembled device depicted in FIG. 9B. In some examples, the assembled device shown in FIG. 9B may for example be manufactured as a single part by three-dimensional (3D) printing the assembly inclusive of the internal channels rather than an assembled of two parts.

As shown in FIG. 9B, the flow meter device 802 may include a set of acoustic devices 810a-d such as the fluidic oscillator, and a bore hole 904. While illustrated with four acoustic devices 810a-d, the flow meter device 802 may include other suitable amounts (e.g., less than four or more than four) of acoustic devices 810. The flow meter device 802 may include any other suitable components.

The flow meter device 802 may include an amount of acoustic devices 810 that corresponds to an amount of phases of fluid from the wellbore 800. For example, if the fluid includes four phases, then the flow meter device 802 may include (e.g., as illustrated) four acoustic devices 810. As illustrated, the acoustic devices 810a-d are positioned near the circumference of the flow meter device 802, but the acoustic devices 810a-d may be positioned in other suitable locations with respect to the flow meter device 802. The acoustic devices 810a-d may be positioned to detect or otherwise sense data relating to one or more phases of the fluid. For example, the acoustic device 810a may be positioned to sense data about a gas phase of the fluid, the acoustic device 810b may be positioned to sense data about a combination oil/gas phase of the fluid, the acoustic device 810c may be positioned to sense data about a water phase of the fluid, etc. The bore hole 304 may be positioned in (or approximately in) the center of the flow meter device 102. The size of the bore hole 904, the shape of the bore hole 904, or a combination thereof may be selected based on expected fluid properties, the acoustic device 810 type or placement, desired measurements, other suitable parameters, or any combination thereof. In some examples, the bore hole 904 may be omitted.

The fluidic oscillators may generate acoustic signals that propagate to sensing fiber (or other suitable detection devices, such as pressure transducers, etc.) behind or within a casing of a wellbore. In some examples, the signals generated by the fluidic oscillator may be detected by one or more DAS systems. Additionally or alternatively to DAS systems, other techniques may be used. The techniques may involve various implementations of Rayleigh scattering, Raman scattering, or Brillouin scattering, and the techniques may be interferometric in nature. The sensing techniques may involve using sensing principles such as homodyne, heterodyne, Michelson, Mach-Zender, Fabry-Perot, phase based, intensity based, coherence based, static (e.g., absolute), or dynamic (e.g., relative). Single-point sensing and multi-point sensing based on Fiber Bragg Gratings or various intrinsic sensing principles or extrinsic sensing principles may also be used in various configurations.

The flow meter device 802 with the fluidic oscillator may meter the multi-phase flow through the acoustic signals, such as through a frequency or flow rate relationship. Additionally, analysis of the acoustic signals in the fluid column may be performed and may be used to determine information (e.g., fluid type, flow rate, etc.) relating to the fluid. In some examples, the analysis can involve using Doppler effects, acoustic velocity, dispersion, attenuation or amplitude effects, and the like. Recording and analyzing the acoustic signals with respect to the fluid may involve recording the signal at one or more points upstream from the flow meter device 802, downstream from the flow meter device, or a combination thereof. Recording and analyzing the acoustic signals may additionally involve array-based acoustic sampling to determine Doppler effects, acoustic velocity, dispersion, amplitude (attenuation) effects, and the like.

Each fluidic oscillator that is included in the flow meter device may oscillate at one frequency, which can be a respective fundamental frequency. The fluidic oscillator may generate acoustic signals corresponding to the fundamental frequency of the fluidic oscillator and associated harmonics. More than one fluidic oscillator may be included in a flow meter device, and each fluidic oscillator in the flow meter device may correspond to a different fundamental frequencies and associated harmonics.

An asymmetric fluidic oscillator may include an outlet channel with an asymmetry that can cause oscillation (e.g., a variation) in the fluid flow rate through the flow meter device 802 as the fluid oscillates from side to side in the device. The oscillating flow rate imparts a pressure wave in the inflow of the fluid, the outflow of the fluid, or a combination thereof. A corresponding reaction force may exist through the flow meter device 802 related to this change in pressure and the corresponding change in momentum of the fluid as the flow rate of the fluid through the device oscillates. The oscillating force at the flow meter device may create an enhanced elastic wave, acoustic wave, or equivalently "seismic wave" that can travel in the solid body (e.g., the casing) to which the flow meter device 802 is attached. Thus, enhanced detection of the oscillation signal by a vibrational sensor, a seismic sensor, or a combination thereof that is included in or attached to the associated solid body, offset from the flow meter device is possible. Similarly, an acoustic sensor, a pressure sensor, or a combination thereof located in the flow upstream from the flow meter device or downstream from the flow meter device 802 may detect the pressure wave upstream or downstream of the flow meter device corresponding to the oscillation of the flow of the fluid through the flow meter device.

An asymmetry may be introduced to the fluidic oscillator of the flow meter device 802 such that, as the fluid oscillates within the fluidic oscillator, the flow of the fluid through the flow meter device can be interrupted, which can cause a variation of the flow rate of the fluid through the flow meter device 802. The variation may impart a force on the flow meter device and a corresponding variation in pressure (e.g., via a pressure wave) upstream of the flow meter device and downstream from the flow meter device. In some examples, the outlet channel of the asymmetric fluidic oscillator may be asymmetric, which can result in an interruption of the flow of the fluid as the fluid oscillates. Pressure waves and elastic waves can be generated upstream and downstream from the asymmetric fluidic oscillator. A pressure sensor located upstream from the asymmetric fluidic oscillator, downstream from the asymmetric fluidic oscillator, or a combination thereof, or a vibration, seismic, optical strain, or strain-rate sensor proximate to the device can detect the pressure waves, the elastic waves, or a combination thereof associated with the flow oscillation. Sensing elements upstream from the asymmetric fluidic oscillator, offset from the asymmetric fluidic oscillator, or a combination thereof can detect an enhanced signal due to the oscillating interruption to the flow of the fluid through the asymmetric fluidic oscillator.

Figure 10A:
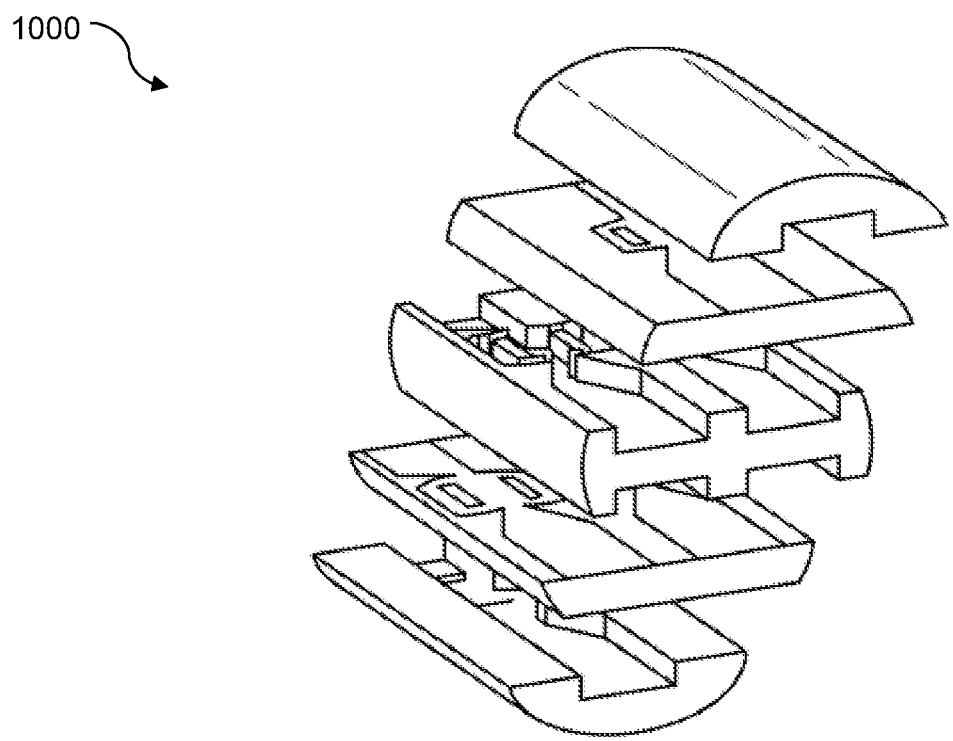
FIGS. 10A-10B illustrate alternate perspective views of a flow meter device assembly, in accordance with embodiments of the present disclosure.
Figure 10B:
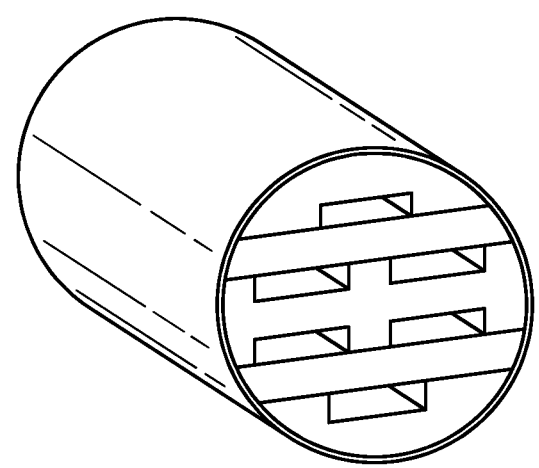

FIGS. 10A-10B illustrate alternate arrangements 1000 of a flow meter device, in accordance with embodiments of the present disclosure. As shown in FIG. 10A and FIG. 10B, an alternate arrangement and method of assembly and manufacturing of the flow meter device may be provided. FIG. 10A may represents a detailed view of separately manufactured (machined) parts of the flow meter device, wherein FIG. 10B may represents an assembled flow meter device. In some embodiments, FIG. 10B may be manufactured as a single assembly using 3D printing.

In some aspects, apparatus and methods for harvesting downhole energy and measuring fluid flow in a downhole environment are provided according to one or more of the following examples.

ADDITIONAL DISCLOSURE

The following are non-limiting, specific embodiments in accordance with the present disclosure:

A first embodiment, which is a downhole energy harvesting apparatus, comprising a fluidic oscillator comprising an inlet channel configured to receive fluid from a wellbore, a feedback system coupled to the inlet channel to oscillate the fluid, and an outlet channel coupled to the feedback system and configured to receive the oscillated fluid from the feedback system, and at least one piezoelectric element disposed on at least one side of the outlet channel and configured to generate an electric signal in response to variations in pressure of the oscillated fluid.

A second embodiment, which is the downhole energy harvesting apparatus of the first embodiment, wherein the fluidic oscillator comprises a symmetric fluidic oscillator, and wherein the outlet channel of the symmetric fluidic oscillator is symmetric about an axis that extends along a direction of fluid flow through the symmetric fluidic oscillator.

A third embodiment, which is the downhole energy harvesting apparatus of any of the first and the second embodiments, wherein the fluidic oscillator comprises an asymmetric fluidic oscillator having the outlet channel comprised of an asymmetric shape, and wherein the asymmetric shape comprises an irregular quadrilateral shape, a triangle shape, or an irregular pentagon shape.

A fourth embodiment, which is the downhole energy harvesting apparatus of any of the first through the third embodiments, wherein the outlet channel includes an asymmetry along an axis oriented in a direction of flow of the fluid through the asymmetric fluidic oscillator, and wherein flow of the fluid through the asymmetric fluidic oscillator is interruptible using the outlet channel.

A fifth embodiment, which is the downhole energy harvesting apparatus of any of the first through the fourth embodiments, wherein the at least one piezoelectric element comprises a piezoelectric film, a piezoelectric ceramic, a piezoelectric crystalline material, and a piezoelectric fiber-composite material.

A sixth embodiment, which is the downhole energy harvesting apparatus of any of the first through the fifth embodiments, wherein the at least one piezoelectric element comprises a plurality of piezoelectric elements.

A seventh embodiment, which is the downhole energy harvesting apparatus of any of the first through the sixth embodiments, wherein the at least one piezoelectric element is coupled to a charging circuit and a downhole energy storage device to store the electric signal.

An eighth embodiment, which is the downhole energy harvesting apparatus of any of the first through the seventh embodiments, wherein the downhole energy storage device comprises a capacitor or a battery configured to power a downhole device, and wherein the downhole device comprises a memory tool, an acoustic sensor, a pressure sensor, a hydrophone, an accelerometer, a vibration sensor, a strain sensor, a capacitance sensor, a resistance sensor, or a transducer.

A ninth embodiment, which is the downhole energy harvesting apparatus of any of the first through the eighth embodiments, wherein the battery is further configured to power the acoustic sensor and/or pressure sensor for measuring signal propagation upstream or downstream to enable doppler shift measurements for flow determination and/or speed of sound measurements for gas-liquid ratio determination.

A tenth embodiment, which is the downhole energy harvesting apparatus of any of the first through the ninth embodiments, wherein the at least one piezoelectric element is coupled to a processor configured to receive the electric signal and to analyze the electric signal to determine a flow rate, a density, a type, or a phase of the oscillated fluid, and wherein the frequency of oscillation relates to the flow rate of the fluid.

An eleventh embodiment, which is the downhole energy harvesting apparatus of any of the first through the tenth embodiments, wherein one or more fluidic oscillators are disposed in a flow meter device for multi-phase measurements, wherein the flow meter device is coupled to a measurement device to detect acoustic signals generated by the flow meter device, and wherein the measurement device comprises a fiber-optic cable, pressure transducer and communicatively coupled to a detection system.

A twelfth embodiment, which is a method to harvest downhole energy, comprising receiving fluid from a wellbore by an inlet channel of a fluidic oscillator, oscillating the fluid by a feedback system of the fluidic oscillator, outputting the fluid oscillated by the feedback system to an outlet channel of the fluidic oscillator, and generating, by at least one piezoelectric element disposed on at least one side of the outlet channel, an electric signal in response to variations in pressure of the oscillated fluid.

A thirteenth embodiment, which is the method of the twelfth embodiment, wherein the fluidic oscillator comprises a symmetric fluidic oscillator, and wherein the outlet channel of the symmetric fluidic oscillator is symmetric about an axis that extends along a direction of fluid flow through the symmetric fluidic oscillator.

A fourteenth embodiment, which is the method of any of the twelfth and the thirteenth embodiments, wherein the fluidic oscillator comprises an asymmetric fluidic oscillator having the outlet channel comprised of an asymmetric shape, and wherein the asymmetric shape comprises an irregular quadrilateral shape, a triangle shape, or an irregular pentagon shape.

A fifteenth embodiment, which is the method of any of the twelfth through the fourteenth embodiments, wherein the outlet channel includes an asymmetry along an axis oriented in a direction of flow of the fluid through the asymmetric fluidic oscillator, and wherein flow of the fluid through the asymmetric fluidic oscillator is interruptible using the outlet channel.

A sixteenth embodiment, which is the method of any of the twelfth through the fifteenth embodiments, further comprising storing the electric signal in a downhole energy storage device coupled to the at least one piezoelectric element, wherein the downhole energy storage device comprises a capacitor or a battery configured to power a downhole device, and wherein the downhole device comprise a memory tool, an acoustic sensor, a pressure sensor, a hydrophone, an accelerometer, a vibration sensor, a strain sensor, a capacitance sensor, a resistance sensor, or a transducer.

A seventeenth embodiment, which is the method of any of the twelfth through the sixteenth embodiments, further comprising analyzing the electric signal to determine a flow rate, a density, a type, or a phase of the oscillated fluid.

An eighteenth embodiment, which is a system, comprising a fluidic oscillator comprising an inlet channel configured to receive fluid from a wellbore, a feedback system coupled to the inlet channel to oscillate the fluid, and an outlet channel coupled to the feedback system and configured to receive the oscillated fluid from the feedback system, at least one piezoelectric element disposed on at least one side of the outlet channel and configured to generate an electric signal in response to variations in pressure of the oscillated fluid, and a processor coupled to the at least one piezoelectric element and configured to analyze the electric signal to determine a flow rate, a density, a type, or a phase of the oscillated fluid.

A nineteenth embodiment, which is the system of the eighteenth embodiment, further comprising a downhole energy storage device coupled to the at least one piezoelectric element and configured to store the electric signal, wherein the downhole energy storage device comprises a capacitor or a battery configured to power a downhole device, and wherein the downhole device comprises a memory tool, an acoustic sensor, a pressure sensor, a hydrophone, an accelerometer, a vibration sensor, a strain sensor, a capacitance sensor, a resistance sensor, or a transducer.

A twentieth embodiment, which is the system of any of the eighteenth or nineteenth embodiments, wherein the fluidic oscillator comprises an asymmetric fluidic oscillator having the outlet channel comprises an asymmetric shape, and wherein the outlet channel includes an asymmetry along an axis oriented in a direction of flow of the oscillated fluid through the asymmetric fluidic oscillator.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Use of the term "optionally" with respect to any element of a claim is intended to mean that the subject element may be present in some embodiments and not present in other embodiments. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of this disclosure. Thus, the claims are a further description and are an addition to the embodiments of this disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

We claim:

1. A downhole energy harvesting apparatus comprising:
    an asymmetric fluidic oscillator comprising:
        an inlet channel configured to receive fluid from a wellbore;
        a feedback system coupled to the inlet channel to oscillate the fluid; and
        an outlet channel coupled to the feedback system configured to receive the oscillated fluid from the feedback system, wherein the outlet channel comprises a first portion and a second portion positioned opposite the first portion, and wherein the first portion and the second portion are non-parallel to each other; and
    at least one piezoelectric element disposed on at least one side of the outlet channel and configured to generate an electric signal in response to variations in pressure of the oscillated fluid.

2. The downhole energy harvesting apparatus of claim 1, wherein the outlet channel comprised of an asymmetric shape, and wherein the asymmetric shape comprises an irregular quadrilateral shape, a triangle shape, or an irregular pentagon shape.

3. The downhole energy harvesting apparatus of claim 2, wherein the outlet channel includes an asymmetry along an axis oriented in a direction of flow of the fluid through the asymmetric fluidic oscillator, and wherein flow of the fluid through the asymmetric fluidic oscillator is interruptible using the outlet channel.

4. The downhole energy harvesting apparatus of claim 1, wherein the at least one piezoelectric element comprises a piezoelectric film, a piezoelectric ceramic, a piezoelectric crystalline material, and a piezoelectric fiber-composite material.

5. The downhole energy harvesting apparatus of claim 1, wherein the at least one piezoelectric element comprises a plurality of piezoelectric elements.

6. The downhole energy harvesting apparatus of claim 1, wherein the at least one piezoelectric element is coupled to a charging circuit and a downhole energy storage device to store the electric signal.

7. The downhole energy harvesting apparatus of claim 6, wherein the downhole energy storage device comprises a capacitor or a battery configured to power a downhole device, and wherein the downhole device comprises a memory tool, an acoustic sensor, a pressure sensor, a hydrophone, an accelerometer, a vibration sensor, a strain sensor, a capacitance sensor, a resistance sensor, or a transducer.

8. The downhole energy harvesting apparatus of claim 7, wherein the battery is further configured to power the acoustic sensor and/or pressure sensor for measuring signal propagation upstream or downstream to enable doppler shift measurements for flow determination and/or speed of sound measurements for gas-liquid ratio determination.

9. The downhole energy harvesting apparatus of claim 7, wherein the downhole device activates based on pre-configured intervals and/or when measured data from the electric signal exceeds predefined deviations from a baseline value.

10. The downhole energy harvesting apparatus of claim 1, wherein the at least one piezoelectric element is coupled to a processor configured to receive the electric signal and to analyze the electric signal to determine a flow rate, a density, a type, or a phase of the oscillated fluid, and wherein the frequency of oscillation relates to the flow rate of the fluid.

11. The downhole energy harvesting apparatus of claim 1, wherein one or more fluidic oscillators are disposed in a flow meter device for multi-phase measurements, wherein the flow meter device is coupled to a measurement device to detect acoustic signals generated by the flow meter device, and wherein the measurement device comprises a fiber-optic cable communicatively coupled to a detection system.

12. A method to harvest downhole energy, comprising:
    receiving fluid from a wellbore by an inlet channel of an asymmetric fluidic oscillator;
    oscillating the fluid by a feedback system of the asymmetric fluidic oscillator;
    outputting the fluid oscillated by the feedback system to an outlet channel of the asymmetric fluidic oscillator, wherein the outlet channel comprises a first portion and a second portion positioned opposite the first portion, and wherein the first portion and the second portion are non-parallel to each other; and
    generating, by at least one piezoelectric element disposed on at least one side of the outlet channel, an electric signal in response to variations in pressure of the oscillated fluid.

13. The method of claim 12, wherein the outlet channel comprised of an asymmetric shape, and wherein the asymmetric shape comprises an irregular quadrilateral shape, a triangle shape, or an irregular pentagon shape.

14. The method of claim 13, wherein the outlet channel includes an asymmetry along an axis oriented in a direction of flow of the fluid through the asymmetric fluidic oscillator, and wherein flow of the fluid through the asymmetric fluidic oscillator is interruptible using the outlet channel.

15. The method of claim 12, further comprising storing the electric signal in a downhole energy storage device coupled to the at least one piezoelectric element, wherein the downhole energy storage device comprises a capacitor or a battery configured to power a downhole device, and wherein the downhole device comprises a memory tool, an acoustic sensor, a pressure sensor, a hydrophone, an accelerometer, a vibration sensor, a strain sensor, a capacitance sensor, a resistance sensor, or a transducer.

16. The method of claim 12, further comprising analyzing the electric signal to determine a flow rate, a density, a type, or a phase of the oscillated fluid.

17. A system comprising:

an asymmetric fluidic oscillator comprising:

an inlet channel configured to receive fluid from a wellbore;

a feedback system coupled to the inlet channel to oscillate the fluid; and an outlet channel coupled to the feedback system and configured to receive the oscillated fluid from the feedback system, wherein the outlet channel comprises a first portion and a second portion positioned opposite the first portion, wherein the first portion and the second portion are non-parallel to each other;

at least one piezoelectric element disposed on at least one side of the outlet channel and configured to generate an electric signal in response to variations in pressure of the oscillated fluid; and a processor coupled to the at least one piezoelectric element and configured to analyze the electric signal to determine a flow rate, a density, a type, or a phase of the oscillated fluid.

18. The system of claim 17, further comprising a downhole energy storage device coupled to the at least one piezoelectric element and configured to store the electric signal, wherein the downhole energy storage device comprises a capacitor or a battery configured to power a downhole device, and wherein the downhole device comprises a memory tool, an acoustic sensor, a pressure sensor, a hydrophone, an accelerometer, a vibration sensor, a strain sensor, a capacitance sensor, a resistance sensor, or a transducer.

19. The system of claim 18, wherein the downhole device activates based on pre-configured intervals and/or when measured data from the electric signal exceeds predefined deviations from a baseline value.

20. The system of claim 17, wherein the outlet channel comprised of an asymmetric shape, and wherein the outlet channel includes an asymmetry along an axis oriented in a direction of flow of the oscillated fluid through the asymmetric fluidic oscillator.

* * * * *